(12) United States Patent
Yang et al.

(10) Patent No.: US 12,261,081 B2
(45) Date of Patent: Mar. 25, 2025

(54) TUNGSTEN FEATURE FILL WITH INHIBITION CONTROL

(71) Applicant: Lam Research Corporation, Fremont, CA (US)

(72) Inventors: Tsung-Han Yang, San Jose, CA (US); Michael Bowes, Scotts Valley, CA (US); Gang Liu, Fremont, CA (US); Anand Chandrashekar, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 605 days.

(21) Appl. No.: 17/430,633

(22) PCT Filed: Feb. 13, 2020

(86) PCT No.: PCT/US2020/018103
§ 371 (c)(1),
(2) Date: Aug. 12, 2021

(87) PCT Pub. No.: WO2020/168071
PCT Pub. Date: Aug. 20, 2020

(65) Prior Publication Data
US 2022/0172987 A1    Jun. 2, 2022

Related U.S. Application Data

(60) Provisional application No. 62/805,197, filed on Feb. 13, 2019.

(51) Int. Cl.
*H01L 21/768* (2006.01)
(52) U.S. Cl.
CPC .. *H01L 21/76843* (2013.01); *H01L 21/76871* (2013.01)

(58) Field of Classification Search
CPC ............... H01L 21/76843; H01L 21/76871
See application file for complete search history.

(56) References Cited

U.S. PATENT DOCUMENTS 4,714,520 A    12/1987  Gwozdz
5,112,439 A     5/1992  Reisman et al.
(Continued)

FOREIGN PATENT DOCUMENTS

CN    1798867 A     7/2006
CN    1883037 A    12/2006
(Continued)

OTHER PUBLICATIONS

Kikuchi, Hirokazu, et al., "Tungsten Through-Silicon via Technology for Three-Dimensional LSIs". Japanese Journal of Applied Physics vol. 47, No. 4, 2008, pp. 2801-2806.*
(Continued)

*Primary Examiner* — Bret P Chen
(74) *Attorney, Agent, or Firm* — Weaver Austin Villenueve & Sampson LLP

(57) ABSTRACT

Methods for selective inhibition control in semiconductor manufacturing are provided. An example method includes providing a substrate including a feature having one or more feature openings and a feature interior. A nucleation layer is formed on a surface of the feature interior. Based on a differential inhibition profile, a nonconformal bulk layer is selectively formed on a surface of the nucleation layer to leave a region of the nucleation layer covered, and a region of the nucleation layer uncovered by the nonconformal bulk layer. An inhibition layer is selectively formed on the covered and uncovered regions of the nucleation layer. Tungsten is deposited in the feature in accordance with the differential inhibition profile.

10 Claims, 12 Drawing Sheets

(56) References Cited

U.S. PATENT DOCUMENTS

| | | | |
|---|---|---|---|
| 5,407,698 A | 4/1995 | Emesh | |
| 5,504,038 A | 4/1996 | Chien et al. | |
| 5,785,796 A | 7/1998 | Lee | |
| 5,963,827 A | 10/1999 | Enomoto et al. | |
| 6,013,575 A | 1/2000 | Itoh | |
| 6,025,243 A | 2/2000 | Ohmi et al. | |
| 6,245,654 B1 | 6/2001 | Shih et al. | |
| 6,339,023 B1 | 1/2002 | Kitazaki et al. | |
| 6,503,843 B1 | 1/2003 | Xia et al. | |
| 6,602,782 B2 | 8/2003 | Lee et al. | |
| 6,641,867 B1 * | 11/2003 | Hsu | H01L 21/28556 427/419.7 |
| 6,790,773 B1 | 9/2004 | Drewery et al. | |
| 7,569,913 B2 | 8/2009 | Enicks | |
| 7,655,567 B1 | 2/2010 | Gao et al. | |
| 8,129,270 B1 | 3/2012 | Chandrashekar et al. | |
| 8,409,985 B2 | 4/2013 | Chan et al. | |
| 9,034,768 B2 | 5/2015 | Chandrashekar et al. | |
| 9,165,824 B2 | 10/2015 | Chandhok et al. | |
| 9,240,347 B2 | 1/2016 | Chandrashekar et al. | |
| 9,349,637 B2 | 5/2016 | Na et al. | |
| 9,653,353 B2 | 5/2017 | Chandrashekar et al. | |
| 9,748,137 B2 | 8/2017 | Lai et al. | |
| 9,837,312 B1 * | 12/2017 | Tan | C23C 18/1628 |
| 9,997,405 B2 | 6/2018 | Chandrashekar et al. | |
| 10,103,058 B2 | 10/2018 | Chandrashekar et al. | |
| 10,170,320 B2 | 1/2019 | Wang et al. | |
| 10,193,059 B2 | 1/2019 | Lee et al. | |
| 10,211,099 B2 | 2/2019 | Wang et al. | |
| 10,242,879 B2 | 3/2019 | Na et al. | |
| 10,256,142 B2 * | 4/2019 | Chandrashekar | H01L 21/76898 |
| 10,381,266 B2 | 8/2019 | Yang et al. | |
| 10,573,522 B2 | 2/2020 | Jandl et al. | |
| 10,580,654 B2 | 3/2020 | Wang et al. | |
| 10,580,695 B2 | 3/2020 | Chandrashekar et al. | |
| 10,916,434 B2 | 2/2021 | Wang et al. | |
| 11,075,115 B2 | 7/2021 | Chandrashekar et al. | |
| 11,355,345 B2 | 6/2022 | Jandl et al. | |
| 11,410,883 B2 | 8/2022 | Chandrashekar et al. | |
| 11,437,269 B2 | 9/2022 | Yang et al. | |
| 11,901,227 B2 | 2/2024 | Chandrashekar et al. | |
| 11,978,666 B2 | 5/2024 | Chandrashekar et al. | |
| 2002/0090811 A1 | 7/2002 | Kim et al. | |
| 2002/0132472 A1 | 9/2002 | Park | |
| 2002/0192953 A1 | 12/2002 | Wang et al. | |
| 2003/0042465 A1 | 3/2003 | Ko | |
| 2003/0082902 A1 | 5/2003 | Fukui et al. | |
| 2003/0092280 A1 | 5/2003 | Lee et al. | |
| 2003/0190802 A1 | 10/2003 | Wang et al. | |
| 2003/0194850 A1 | 10/2003 | Lewis et al. | |
| 2003/0203123 A1 | 10/2003 | Shang et al. | |
| 2003/0222346 A1 | 12/2003 | Yun et al. | |
| 2004/0149386 A1 | 8/2004 | Numasawa et al. | |
| 2005/0014365 A1 | 1/2005 | Moon et al. | |
| 2005/0147762 A1 | 7/2005 | Dubin et al. | |
| 2005/0179141 A1 | 8/2005 | Yun et al. | |
| 2006/0009034 A1 | 1/2006 | Lai et al. | |
| 2006/0075966 A1 | 4/2006 | Chen et al. | |
| 2006/0265100 A1 | 11/2006 | Li | |
| 2007/0066060 A1 | 3/2007 | Wang | |
| 2007/0166989 A1 | 7/2007 | Fresco et al. | |
| 2007/0199922 A1 | 8/2007 | Shen et al. | |
| 2007/0264105 A1 | 11/2007 | Pharand et al. | |
| 2008/0054468 A1 | 3/2008 | Choi et al. | |
| 2008/0079156 A1 | 4/2008 | Choi et al. | |
| 2008/0081470 A1 | 4/2008 | Clark | |
| 2008/0254623 A1 | 10/2008 | Chan et al. | |
| 2008/0268635 A1 * | 10/2008 | Yu | H01L 21/76877 438/655 |
| 2009/0004850 A1 * | 1/2009 | Ganguli | C23C 16/45523 438/655 |
| 2009/0053426 A1 | 2/2009 | Lu et al. | |
| 2009/0053893 A1 | 2/2009 | Khandelwal et al. | |
| 2009/0149022 A1 | 6/2009 | Chan et al. | |
| 2009/0163025 A1 | 6/2009 | Humayun et al. | |
| 2009/0183984 A1 | 7/2009 | Sakuma et al. | |
| 2010/0072623 A1 | 3/2010 | Prindle et al. | |
| 2010/0130002 A1 | 5/2010 | Dao et al. | |
| 2010/0144140 A1 | 6/2010 | Chandrashekar et al. | |
| 2010/0159694 A1 | 6/2010 | Chandrashekar et al. | |
| 2010/0167527 A1 | 7/2010 | Wu et al. | |
| 2010/0267230 A1 | 10/2010 | Chandrashekar et al. | |
| 2010/0267235 A1 | 10/2010 | Chen et al. | |
| 2011/0045672 A1 | 2/2011 | Srinivasan et al. | |
| 2011/0111533 A1 | 5/2011 | Varadarajan et al. | |
| 2011/0151670 A1 | 6/2011 | Lee et al. | |
| 2011/0223763 A1 | 9/2011 | Chan et al. | |
| 2011/0233778 A1 | 9/2011 | Lee et al. | |
| 2011/0256717 A1 | 10/2011 | Choi et al. | |
| 2012/0009785 A1 * | 1/2012 | Chandrashekar | C23F 4/00 257/E21.585 |
| 2012/0077342 A1 | 3/2012 | Gao et al. | |
| 2012/0149213 A1 | 6/2012 | Nittala et al. | |
| 2012/0177845 A1 | 7/2012 | Odedra et al. | |
| 2012/0187305 A1 | 7/2012 | Elam et al. | |
| 2012/0190188 A1 | 7/2012 | Zhao et al. | |
| 2013/0062677 A1 | 3/2013 | Li et al. | |
| 2013/0171822 A1 * | 7/2013 | Chandrashekar | C23C 16/04 118/696 |
| 2013/0260555 A1 | 10/2013 | Zope et al. | |
| 2013/0302980 A1 * | 11/2013 | Chandrashekar | H10B 12/488 438/666 |
| 2014/0106083 A1 | 4/2014 | Wu et al. | |
| 2014/0120723 A1 | 5/2014 | Fu et al. | |
| 2014/0231896 A1 | 8/2014 | Matsumori et al. | |
| 2014/0264932 A1 | 9/2014 | Ting et al. | |
| 2014/0349477 A1 * | 11/2014 | Chandrashekar | H01L 21/76841 156/345.24 |
| 2015/0024592 A1 * | 1/2015 | Chandrashekar | H01L 21/28568 438/675 |
| 2015/0091175 A1 | 4/2015 | Chandhok et al. | |
| 2015/0093890 A1 | 4/2015 | Blackwell et al. | |
| 2015/0162214 A1 | 6/2015 | Thompson et al. | |
| 2015/0294906 A1 | 10/2015 | Wu et al. | |
| 2015/0361547 A1 | 12/2015 | Lin et al. | |
| 2016/0020169 A1 | 1/2016 | Matsuda | |
| 2016/0056074 A1 | 2/2016 | Na et al. | |
| 2016/0056077 A1 | 2/2016 | Lai et al. | |
| 2016/0093528 A1 * | 3/2016 | Chandrashekar | C23C 16/00 438/666 |
| 2016/0118345 A1 | 4/2016 | Chen et al. | |
| 2016/0172211 A1 | 6/2016 | Demos et al. | |
| 2016/0190008 A1 | 6/2016 | Chandrashekar et al. | |
| 2016/0293467 A1 | 10/2016 | Caveney et al. | |
| 2016/0343612 A1 * | 11/2016 | Wang | H01L 21/76856 |
| 2017/0053811 A1 * | 2/2017 | Fung | C23C 16/045 |
| 2017/0125548 A1 | 5/2017 | Hung et al. | |
| 2017/0229341 A1 | 8/2017 | Chang et al. | |
| 2017/0278749 A1 | 9/2017 | Chandrashekar et al. | |
| 2017/0365513 A1 * | 12/2017 | Yang | H01L 21/76876 |
| 2018/0053660 A1 | 2/2018 | Jandl et al. | |
| 2018/0174901 A1 | 6/2018 | Wang et al. | |
| 2018/0174963 A1 | 6/2018 | Chen et al. | |
| 2018/0277431 A1 | 9/2018 | Chandrashekar et al. | |
| 2018/0308701 A1 | 10/2018 | Na et al. | |
| 2018/0315650 A1 * | 11/2018 | Ren | H01L 23/5226 |
| 2019/0019725 A1 | 1/2019 | Chandrashekar et al. | |
| 2019/0080914 A1 | 3/2019 | Wang et al. | |
| 2019/0206731 A1 | 7/2019 | Chandrashekar et al. | |
| 2019/0326168 A1 | 10/2019 | Yang et al. | |
| 2020/0083251 A1 | 3/2020 | Lee | |
| 2020/0144066 A1 | 5/2020 | Jandl et al. | |
| 2020/0185225 A1 | 6/2020 | Wang et al. | |
| 2020/0185273 A1 | 6/2020 | Chandrashekar et al. | |
| 2021/0028187 A1 | 1/2021 | Byeon et al. | |
| 2021/0125832 A1 | 4/2021 | Bhatnagar | |
| 2021/0327754 A1 | 10/2021 | Chandrashekar et al. | |
| 2022/0020641 A1 | 1/2022 | Chandrashekar et al. | |
| 2022/0102208 A1 | 3/2022 | Chandrashekar et al. | |
| 2022/0359280 A1 | 11/2022 | Yang et al. | |

(56) References Cited

U.S. PATENT DOCUMENTS

| | | |
|---|---|---|
| 2023/0041794 A1 | 2/2023 | Chandrashekar et al. |
| 2023/0122846 A1 | 4/2023 | Khare et al. |
| 2023/0130557 A1 | 4/2023 | Birru et al. |
| 2024/0234208 A1 | 7/2024 | Chandrashekar et al. |
| 2025/0038050 A1 | 1/2025 | Tran et al. |

FOREIGN PATENT DOCUMENTS

| | | |
|---|---|---|
| CN | 101154576 A | 4/2008 |
| CN | 101213320 A | 7/2008 |
| CN | 101308794 A | 11/2008 |
| CN | 101313085 A | 11/2008 |
| CN | 101447427 A | 6/2009 |
| CN | 101770978 A | 7/2010 |
| CN | 101789369 A | 7/2010 |
| CN | 101899649 A | 12/2010 |
| CN | 102007573 A | 4/2011 |
| CN | 102074500 A | 5/2011 |
| CN | 102224574 A | 10/2011 |
| CN | 102543835 A | 7/2012 |
| CN | 102574884 A | 7/2012 |
| CN | 102892922 A | 1/2013 |
| CN | 103107120 A | 5/2013 |
| CN | 103125013 A | 5/2013 |
| CN | 104081502 A | 10/2014 |
| CN | 104272440 A | 1/2015 |
| CN | 104513973 A | 4/2015 |
| CN | 104752339 A | 7/2015 |
| CN | 104975268 A | 10/2015 |
| CN | 105390438 A | 3/2016 |
| CN | 105405764 A | 3/2016 |
| CN | 106169440 A | 11/2016 |
| CN | 107768304 A | 3/2018 |
| CN | 110004429 B | 8/2021 |
| CN | 113424308 | 9/2021 |
| EP | 0430303 A2 | 6/1991 |
| EP | 1672687 A1 | 6/2006 |
| EP | 2779224 A2 | 9/2014 |
| JP | H0225568 A | 1/1990 |
| JP | H02187031 A | 7/1990 |
| JP | H03110840 A | 5/1991 |
| JP | H04142061 A | 5/1992 |
| JP | H05226280 A | 9/1993 |
| JP | H0794488 A | 4/1995 |
| JP | H07147321 A | 6/1995 |
| JP | H07226393 A | 8/1995 |
| JP | H0922896 A | 1/1997 |
| JP | 2002016066 A | 1/2002 |
| JP | 2002294449 A | 10/2002 |
| JP | 2003022985 A | 1/2003 |
| JP | 2007251164 A | 9/2007 |
| JP | 2008049976 A | 3/2008 |
| JP | 2008177577 A | 7/2008 |
| JP | 2009024252 A | 2/2009 |
| JP | 2010251760 A | 11/2010 |
| JP | 2010541252 A | 12/2010 |
| JP | 2011035366 A | 2/2011 |
| JP | 2011199021 A | 10/2011 |
| JP | 2011228709 A | 11/2011 |
| JP | 2014063926 A | 4/2014 |
| JP | 2014183185 A | 9/2014 |
| JP | 2015514160 A | 5/2015 |
| JP | 2016025141 A | 2/2016 |
| JP | 2022520394 | 3/2022 |
| KR | 19980011846 U | 5/1998 |
| KR | 20010030488 A | 4/2001 |
| KR | 20010048302 A | 6/2001 |
| KR | 20030092583 A | 12/2003 |
| KR | 20040087406 A | 10/2004 |
| KR | 20050008320 A | 1/2005 |
| KR | 20050087428 A | 8/2005 |
| KR | 100528073 B1 | 11/2005 |
| KR | 20060087844 A | 8/2006 |
| KR | 20070054100 A | 5/2007 |
| KR | 100757418 B1 | 9/2007 |
| KR | 20080001460 A | 1/2008 |
| KR | 20080061978 A | 7/2008 |
| KR | 20080094088 A | 10/2008 |
| KR | 20090068187 A | 6/2009 |
| KR | 20090074560 A | 7/2009 |
| KR | 20100067065 A | 6/2010 |
| KR | 20100114856 A | 10/2010 |
| KR | 20110052436 A | 5/2011 |
| KR | 20110108382 A | 10/2011 |
| KR | 20120005992 A | 1/2012 |
| KR | 20120043077 A | 5/2012 |
| KR | 20140141686 A | 12/2014 |
| KR | 20140143202 A | 12/2014 |
| KR | 20150063562 A | 6/2015 |
| KR | 20160039139 A | 4/2016 |
| KR | 20160044004 A | 4/2016 |
| KR | 20160108174 A | 9/2016 |
| TW | 201120233 A | 6/2011 |
| TW | 201130045 A | 9/2011 |
| TW | 201405707 A | 2/2014 |
| TW | 201405781 A | 2/2014 |
| TW | 201413031 A | 4/2014 |
| TW | 201525173 A | 7/2015 |
| TW | 201626503 A | 7/2016 |
| WO | WO-2007027350 A2 | 3/2007 |
| WO | WO-2009042913 A1 | 4/2009 |
| WO | WO-2011027834 A1 | 3/2011 |
| WO | WO-2013148444 A1 | 10/2013 |
| WO | WO-2013148490 A1 | 10/2013 |
| WO | WO-2013148880 A1 | 10/2013 |
| WO | WO-2014105477 A1 | 7/2014 |
| WO | WO-2020168071 A1 | 8/2020 |

OTHER PUBLICATIONS

Coughlan, J., et al., "Investigations of Stress Distributions in Tungsten-Filled via Structures Using Finite Element Analysis". Microelectron. Reliab., vol. 37, No. 10/11, 1997, pp. 1549-1552.*

Kang, S., et al., "Application of Selective CVD Tungsten for Low Contact Resistance via Filling to Aluminum Multilayer Interconnection". Journal of Electronic Materials, vol. 17, No. 3, 1988, pp. 213-216.*

"Chinese Application Serial No. 202080014189.3, Office Action mailed Feb. 29, 2024", w/ English translation, 15 pgs.

International Application Serial No. PCT/US2020/018103, International Search Report mailed Jun. 8, 2020, 3 pgs.

International Application Serial No. PCT/US2020/018103, Written Opinion mailed Jun. 8, 2020, 3 pgs.

"International Application Serial No. PCT US2020 018103, International Preliminary Report on Patentability mailed Aug. 26, 2021", 6 pages.

Advisory Action dated Sep. 1, 2021, in U.S. Appl. No. 16/294,736.

Advisory Action dated Sep. 1, 2021, in U.S. Appl. No. 16/457,353.

Chinese First Office Action dated Apr. 2, 2021 issued in Application No. CN 201910499775.0.

Chinese First Office Action dated Dec. 12, 2017 issued in Application No. CN 201510518752.1.

Chinese First Office Action dated Dec. 20, 2017 issued in Application No. CN 201510644832.1.

Chinese First Office Action dated Feb. 26, 2016, issued in CN 201380022648.2.

Chinese First Office Action dated Jan. 4, 2021 issued in Application No. CN 201710700258.6.

Chinese first Office Action dated Jul. 27, 2018 issued in Application No. CN 201610332922.1.

Chinese First Office Action dated Jun. 3, 2019 issued in Application No. CN 201711372325.2.

Chinese Second Office Action dated Aug. 17, 2018 issued in Application No. CN 201510644832.1.

Chinese Second Office Action dated Aug. 24, 2018 issued in Application No. CN 201510518752.1.

Chinese Second Office Action dated Jun. 17, 2021 issued in Application No. CN 201710700258.6.

Chinese Second Office Action dated May 7, 2020 issued in Application No. CN 201711372325.2.

(56) References Cited

OTHER PUBLICATIONS

Chinese Third Office Action dated Dec. 1, 2020 issued in Application No. CN 201711372325.2.
Chinese Third Office Action dated Feb. 14, 2019 issued in Application No. CN 201510644832.1.
Chinese Third Office [Decision of Final Rejection] Action dated Mar. 6, 2019 issued in Application No. CN 201510518752.1.
CN Office action dated Apr. 7, 2022 in CN Application No. CN201910499775 with English translation.
CN Office action dated Aug. 2, 2022 in CN Application No. CN201910499775 with English translation.
CN Office Action dated Aug. 16, 2023, in Application No. CN201810358633.8 with English translation.
CN Office Action dated Aug. 24, 2018 in Application No. CN 201380022693.8 with English Translation.
CN Office Action dated Dec. 8, 2022, in Application No. CN201980081000.X with English translation.
CN Office Action dated Dec. 28, 2023 in CN Application No. 201980081000.X with English Translation.
CN Office Action dated Feb. 15, 2023, in Application No. CN201810358633.8 with English translation.
CN Office Action dated Jan. 23, 2017 in Application No. CN 201380022693.8 with English Translation.
CN Office Action dated Jul. 26, 2024 in CN Application No. 202110914064.2, with EnglishTranslation.
CN Office Action dated Jun. 29, 2023, in Application No. CN201980081000.X with English translation.
CN Office Action dated Mar. 15, 2018 in Application No. CN 201380022693.8 with English Translation.
CN Office Action dated Mar. 18, 2016 in Application No. CN 201380022693.8 with English Translation.
CN Office Action dated Mar. 31, 2023, in Application No. CN201910729470.4 with English translation.
CN Office Action dated Oct. 11, 2023, in application No. CN202110914064.2 with Englishtranslation.
CN Office Action dated Oct. 12, 2023, in application No. CN202110637340.5 with English translation.
CN Office action dated Oct. 25, 2021 in CN Application No. CN201910499775 with English translation.
CN Office Action dated Oct. 26, 2022 in Application No. CN201910729470 With EnglishTranslation.
CN Office Action dated Oct. 27, 2020 in Application No. CN 201811491805.5 with English Translation.
CN Office Action dated Sep. 25, 2017 in Application No. CN 201380022693.8 with English Translation.
International Preliminary Report on Patentability and Written Opinion dated Jun. 20, 2024 in PCT Application No. PCT/US2022/081047.
International Preliminary Report on Patentability and Written Opinion dated Jun. 27, 2024 in PCT Application No. PCT/US2022/081398.
International Preliminary Report on Patentability and Written Opinion dated Oct. 9, 2014, in Application No. 2013/034167.
International Preliminary Report on Patentability and written opinion dated Sep. 15, 2022, in PCT Application No. PCT/US2021/020748.
International Preliminary Report on Patentability dated Jun. 17, 2021 issued in Application No. PCT/US2019/064768.
International Preliminary Report on Patentability dated Oct. 6, 2022, in PCT Application No. PCT/US2021/022152.
International Search Report and Written Opinion dated Apr. 20, 2023, in Application No. PCT/US2022/081047.
International Search Report and Written Opinion dated Apr. 20, 2023 in PCT Application No. PCT/US2022/081398.
International Search Report and Written Opinion dated Jul. 1, 2021 in Application No. PCT/US2021/022152.
International Search Report and Written Opinion, dated Jul. 26, 2013, in Application No. 2013/034167.
International Search Report and Written Opinion dated Jun. 18, 2021, in PCT Application No. PCT/US2021/020748.
International Search Report and Written Opinion dated Mar. 27, 2020 issued in Application No. PCT/US2019/064768.
Japanese First Office Action dated Jun. 13, 2019 issued in Application No. JP 2015-162354.
Japanese Office Action dated Jan. 24, 2017, issued in JP 2015-514160.
Japanese Second Office Action dated Feb. 16, 2020 issued in Application No. JP 2015-162354.
JP Office Action dated Dec. 20, 2016 in Application No. JP 2015-503547 with English Translation.
JP Office Action dated May 28, 2024 in JP Application No. 2021-531900, with English Translation.
JP Office Action dated Nov. 28, 2023 in JP Application No. 2021-531900, with English Translation.
Kim, C. et al., "Pulsed CVD-W Nucleation Layer Using WF6 and B2H6 for Low Resistivity W", Journal of The Electrochemical Society, 2009, vol. 156, No. 9, pp. H685-H689.
Korean Decision for Grant dated Jan. 15, 2020 issued in Application No. KR 10-2014-7029798.
Korean Office Action dated Jun. 18, 2019 issued in Application No. KR 10-2014-7029798.
Korean Second Office Action dated Oct. 25, 2019 issued in Application No. KR 10-2014-7029798.
KR Decision for Grant dated Apr. 7, 2020 in Application No. KR 10-2020-7000199 with English Translation.
KR Office Action dated Apr. 18, 2019 in Application No. KR 10-2014-7030125 with English Translation.
KR Office Action dated Aug. 1, 2022, in Application No. 10-2017-0172906 with English translation.
KR Office Action dated Dec. 28, 2022 in Application No. KR10-2015-0137906 with English translation.
KR Office Action dated Feb. 8, 2022, in Application No. 10-2017-0172906 with English translation.
KR Office Action dated Feb. 14, 2023 in Application No. KR10-2023-0013752 with English translation.
KR Office Action dated Feb. 21, 2022, in Application No. KR10-2017-0102113 with English Translation.
KR Office Action dated Feb. 23, 2023 in Application No. KR10-2018-0044769 with English translation.
KR Office Action dated Feb. 26, 2024 in KR Application No. 10-2015-0137906, with English Translation.
KR Office Action dated Jan. 27, 2023 in Application No. KR10-2017-0102113 with English Translation.
KR Office Action dated Jul. 19, 2024 in KR Application No. 10-2021-7021040 with English translation.
KR Office Action dated Jul. 28, 2023, in Application No. KR10-2023-0081299 with English Translation.
KR Office Action dated Jun. 26, 2022 in Application No. KR10-2015-0137906 with English translation.
KR Office Action dated Jun. 27, 2024 in KR Application No. 10-2023-0081299, with English Translation.
KR Office Action dated May 12, 2023 in Application No. KR10-2016-0060657 with English translation.
KR Office Action dated May 30, 2017, in Application No. KR 10-2013-0054726 with English Translation.
KR Office Action dated Nov. 1, 2022, in Application No. 10-2017-0172906 with English translation.
KR Office Action dated Nov. 16, 2012, in Application No. KR 2011-0068603 with English Translation.
KR Office Action dated Oct. 26, 2023 in KR Application No. 10-2015-0137906, with English Translation.
KR Office Action dated Sep. 19, 2017, in Application No. KR 10-2013-0054726 with English Translation.
KR Office Action dated Sep. 26, 2016, in Application No. KR 10-2013-0054726 with English Translation.
KR Office Action dated Sep. 27, 2022, in Application No. KR10-2017-0102113 with English translation.
Notice of Allowance dated Oct. 5, 2020 issued in U.S. Appl. No. 16/786,513.
Office Action dated Mar. 27, 2020 issued in U.S. Appl. No. 16/786,513.
PCT International Preliminary Report on Patentability and Written Opinion, dated Oct. 9, 2014, issued in PCT/US2013/033174.

(56) References Cited

OTHER PUBLICATIONS

PCT International Search Report and Written Opinion, dated Jun. 28, 2013, issued in PCT/US2013/033174.
Taiwan Office Action and Search Report dated Nov. 22, 2016 issued in Application No. TW 102110937.
Taiwanese First Office Action dated Apr. 18, 2019 issued in Application No. TW 104127083.
Taiwanese First Office Action dated Apr. 21, 2021 issued in Application No. TW 106144306.
Taiwanese First Office Action dated Jul. 23, 2021 issued in Application No. TW 107113100.
Taiwanese First Office Action dated Mar. 28, 2019 issued in Application No. TW 104132010.
Taiwanese First Office Action dated Sep. 5, 2019 issued in Application No. TW 105115121.
Taiwanese Second Office Action dated Feb. 6, 2020 issued in Application No. TW 104132010.
Taiwanese Second Office Action dated Mar. 16, 2020 issued in Application No. TW 104127083.
TW Office Action dated Jun. 28, 2023 in Application No. TW111120546 with English translation.
TW Office Action dated Oct. 25, 2016 in Application No. TW 102110947 with English Translation.
U.S. Advisory Action dated Aug. 11, 2023, in U.S. Appl. No. 17/497,702.
U.S. Corrected Notice of Allowance dated Jun. 30, 2022 in U.S. Appl. No. 16/294,736.
U.S. Corrected Notice of Allowance dated Aug. 8, 2022 in U.S. Appl. No. 16/457,353.
U.S. Corrected Notice of Allowance dated Feb. 16, 2022, in U.S. Appl. No. 16/724,231.
U.S. Corrected Notice of Allowance dated Jan. 10, 2024 in U.S. Appl. No. 17/497,702.
U.S. Corrected Notice of Allowance dated May 11, 2022, in U.S. Appl. No. 16/724,231.
U.S. Final Office Action dated Apr. 14, 2017, in U.S. Appl. No. 14/965,806.
US Final Office Action dated Apr. 8, 2021 issued in U.S. Appl. No. 16/793,464.
US Final Office Action dated Aug. 13, 2018 issued in U.S. Appl. No. 15/492,976.
U.S. Final Office Action dated Dec. 15, 2020 in U.S. Appl. No. 16/124,050.
U.S. Final Office Action dated Feb. 6, 2020 in U.S. Appl. No. 16/124,050.
US Final Office Action, dated Jan. 18, 2017, issued in U.S. Appl. No. 13/774,350.
U.S. Final Office Action dated Jul. 17, 2015 in U.S. Appl. No. 14/502,817.
US Final Office Action dated Jul. 5, 2019 issued in U.S. Appl. No. 15/991,413.
US Final Office Action, dated Jul. 6, 2018, issued in U.S. Appl. No. 13/774,350.
US Final Office Action dated Jun. 10, 2019 issued in U.S. Appl. No. 15/673,320.
US Final Office Action, dated Jun. 14, 2021, issued in U.S. Appl. No. 16/294,736.
US Final Office Action dated Jun. 14, 2021, issued in U.S. Appl. No. 16/457,353.
US Final Office Action, dated Jun. 18, 2018, issued in U.S. Appl. No. 15/384,175.
U.S. Final Office Action dated Jun. 28, 2023, in U.S. Appl. No. 17/359,068.
U.S. Final Office Action dated Mar. 28, 2024 in U.S. Appl. No. 17/359,068.
US Final Office Action dated Mar. 29, 2021 issued in U.S. Appl. No. 16/724,231.
U.S. Final Office Action dated May 3, 2024 in U.S. Appl. No. 17/814,297.
U.S. Final Office Action dated May 16, 2023 in U.S. Appl. No. 17/497,702.
US Final Office Action, dated Nov. 2, 2018, issued in U.S. Appl. No. 15/640,940.
US Final Office Action dated Oct. 19, 2017 issued in U.S. Appl. No. 14/866,621.
U.S. Non-Final Office Action dated Dec. 18, 2014 in U.S. Appl. No. 14/502,817.
U.S. Non-Final Office Action dated Dec. 23, 2014 in U.S. Appl. No. 13/851,885.
U.S. Non-Final Office Action dated Feb. 2, 2023 in U.S. Appl. No. 17/497,702.
U.S. Non-Final office Action dated Jan. 5, 2023 in U.S. Appl. No. 17/359,068.
U.S. Non-Final Office Action dated Jul. 7, 2023, in U.S. Appl. No. 17/809,480.
U.S. Non-Final Office Action dated Jun. 20, 2024 in U.S. Appl. No. 17/809,480.
U.S. Non-Final Office Action dated Jun. 22, 2023, in U.S. Appl. No. 17/814,297.
U.S. Non-Final Office Action dated Jun. 23, 2020 in U.S. Appl. No. 16/124,050.
U.S. Non-Final Office Action dated Nov. 8, 2023 in U.S. Appl. No. 17/359,068.
U.S. Non-Final Office Action dated Nov. 25, 2011 in U.S. Appl. No. 13/016,656.
U.S. Non-Final Office Action dated Sep. 11, 2017 in U.S. Appl. No. 14/965,806.
U.S. Non-Final Office Action dated Sep. 2, 2016 in U.S. Appl. No. 14/965,806.
U.S. Non-Final Office Action dated Sep. 24, 2019 in U.S. Appl. No. 16/124,050.
U.S. Notice of Allowance dated Apr. 3, 2024 in U.S. Appl. No. 17/299,753.
US Notice of Allowance dated Apr. 27, 2017 issued in U.S. Appl. No. 14/873,152.
U.S. Notice of Allowance dated Apr. 27, 2022 in U.S. Appl. No. 16/457,353.
US Notice of Allowance dated Aug. 10, 2018 issued in U.S. Appl. No. 15/156,129.
U.S. Notice of Allowance dated Aug. 3, 2016 in U.S. Appl. No. 13/851,885.
U.S. Notice of Allowance dated Dec. 14, 2016 in U.S. Appl. No. 13/851,885.
U.S. Notice of Allowance dated Dec. 26, 2023 in U.S. Appl. No. 17/299,753.
US Notice of Allowance dated Feb. 13, 2018 issued in U.S. Appl. No. 14/866,621.
U.S. Notice of Allowance dated Feb. 14, 2024 in U.S. Appl. No. 17/299,753.
U.S. Notice of Allowance dated Feb. 2, 2022 in U.S. Appl. No. 16/724,231.
U.S. Notice of Allowance dated Feb. 26, 2024 in U.S. Appl. No. 17/809,480.
U.S. Notice of Allowance dated Jan. 8, 2024 in U.S. Appl. No. 17/299,753.
US Notice of Allowance dated Jan. 14, 2016 issued in U.S. Appl. No. 14/465,610.
U.S. Notice of Allowance dated Jan. 9, 2012 in U.S. Appl. No. 13/016,656.
US Notice of Allowance, dated Jun. 6, 2018, issued in U.S. Appl. No. 15/482,271.
US Notice of Allowance, dated Mar. 12, 2019, issued in U.S. Appl. No. 15/640,940.
U.S. Notice of Allowance dated Mar. 15, 2024 in U.S. Appl. No. 17/809,480.
U.S. Notice of Allowance dated Mar. 17, 2021 in U.S. Appl. No. 16/124,050.
U.S. Notice of Allowance dated Mar. 23, 2022 in U.S. Appl. No. 16/294,736.
U.S. Notice of Allowance dated Mar. 24, 2017 in U.S. Appl. No. 13/851,885.

(56) References Cited

OTHER PUBLICATIONS

US Notice of Allowance dated Nov. 13, 2018 issued in U.S. Appl. No. 15/492,976.
US Notice of Allowance, dated Nov. 30, 2018, issued in U.S. Appl. No. 13/774,350.
US Notice of Allowance dated Oct. 21, 2016 issued in U.S. Appl. No. 14/866,621.
US Notice of Allowance dated Oct. 23, 2019 issued in U.S. Appl. No. 16/189,368.
US Notice of Allowance dated Oct. 24, 2019 issued in U.S. Appl. No. 15/991,413.
US Notice of Allowance, dated Oct. 3, 2018, issued in U.S. Appl. No. 15/384,175.
U.S. Notice of Allowance dated Sep. 5, 2023, in U.S. Appl. No. 17/497,702.
U.S. Notice of Allowance dated Sep. 25, 2015 in U.S. Appl. No. 14/502,817.
US Notice of Allowance dated Sep. 26, 2019 issued in U.S. Appl. No. 15/673,320.
US Notice of allowance dated Sep. 29, 2021 issued in U.S. Appl. No. 16/724,231.
US Office Action dated Apr. 6, 2020, issued in U.S. Appl. No. 16/457,353.
US Office Action dated Apr. 8, 2019 issued in U.S. Appl. No. 16/189,368.
US Office Action, dated Dec. 12, 2017, issued in U.S. Appl. No. 15/482,271.
US Office Action dated Dec. 15, 2017 issued in U.S. Appl. No. 15/156,129.
US Office Action dated Dec. 21, 2018 issued in U.S. Appl. No. 15/673,320.
US Office Action, dated Dec. 7, 2020, issued in U.S. Appl. No. 16/294,736.
US Office Action dated Dec. 8, 2020, issued in U.S. Appl. No. 16/457,353.
US Office Action dated Feb. 5, 2019 issued in U.S. Appl. No. 15/991,413.
US Office Action, dated Jan. 15, 2015, issued in U.S. Appl. No. 13/774,350.
US Office Action, dated Jun. 2, 2016, issued in U.S. Appl. No. 13/774,350.
US Office Action dated Mar. 21, 2018 issued in U.S. Appl. No. 15/492,976.
US Office Action, dated Mar. 26, 2018, issued in U.S. Appl. No. 15/640,940.
US Office Action, dated May 15, 2020, issued in U.S. Appl. No. 16/294,736.
US Office Action dated May 18, 2017 issued in U.S. Appl. No. 14/866,621.
US Office Action dated May 25, 2016 issued in U.S. Appl. No. 14/866,621.
US Office Action dated Nov. 1, 2016 issued in U.S. Appl. No. 14/873,152.
US Office Action, dated Nov. 20, 2017, issued in U.S. Appl. No. 15/384,175.
US Office Action dated Oct. 30, 2020 issued in U.S. Appl. No. 16/793,464.
US Office Action, dated Oct. 8, 2015, issued in U.S. Appl. No. 13/774,350.
US Office Action, dated Sep. 20, 2017, issued in U.S. Appl. No. 13/774,350.
US Office Action dated Sep. 22, 2020 issued in U.S. Appl. No. 16/724,231.
US Office Action dated Sep. 3, 2015 issued in U.S. Appl. No. 14/465,610.
U.S. Appl. No. 17/809,480, inventors Chandrashekar et al., filed Jun. 28, 2022.
U.S. Appl. No. 17/907,377 inventors Khare et al., filed Sep. 26, 2022.
U.S. Appl. No. 18/715,602, inventor Tran S, filed May 31, 2024.
U.S. Appl. No. 18/717,059, inventor Yan Z, filed Jun. 6, 2024.
U.S. Restriction Requirement dated Sep. 15, 2022 in U.S. Appl. No. 17/359,068.
Van Zant, P., "Microchip fabrication: a practical guide to semiconductor processing" 4th ed., (2000) p. 263. [ISBN 0-07-135636-3].
Williams et al., "Etch Rates for Micromachining Processing—Part II" Journal of Microelectromechanical Systems, vol. 12, No. 6, Dec. 2003, pp. 761-778.
CN Office Action dated Aug. 21, 2024 in CN Application No. 202110637340.5 with English translation.
KR Office Action dated Sep. 30, 2024 in KR Application No. 10-2015-0137906 with English Translation.
TW Office Action dated Sep. 6, 2024 in TW Application No. 110107688 with English translation.
U.S. Final Office Action dated Sep. 30, 2024 in U.S. Appl. No. 17/809,480.
U.S. Non-Final Office Action dated Sep. 16, 2024 in U.S. Appl. No. 17/814,297.
CN Office Action dated Dec. 17, 2024 in CN Application No. 202110914064.2, with English Translation.
JP Office Action dated Nov. 26, 2024 in JP Application No. 2021-531900, with English Translation.
KR Notice of Allowance dated Nov. 25, 2024 in KR Application No. 10-2023-0081299, with English Translation.
U.S. Non-Final Office Action dated Dec. 19, 2024 in U.S. Appl. No. 17/809,480.
JP Office Action dated Jan. 7, 2025 in JP Application No. 2021-547160 with English translation.

\* cited by examiner

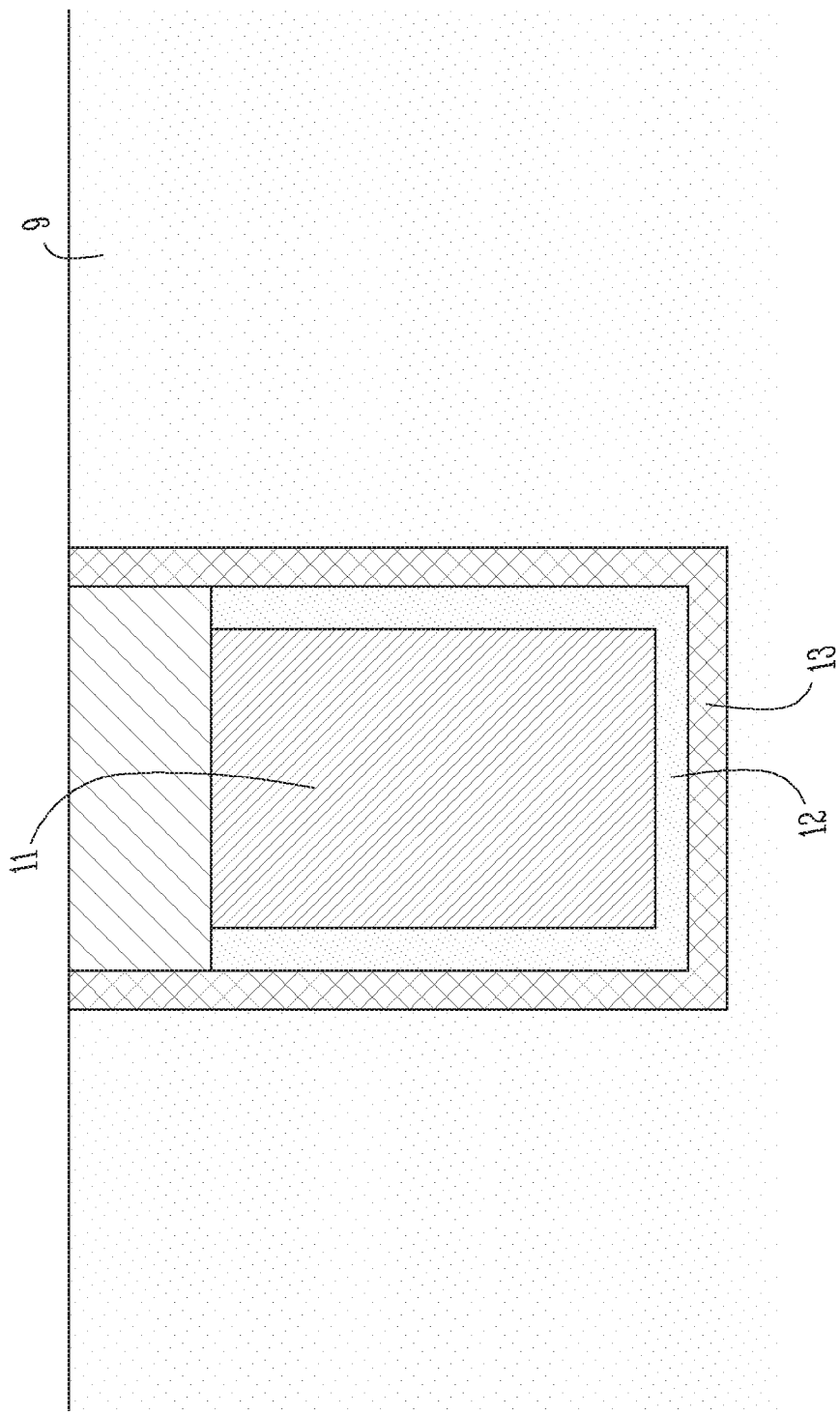

TUNGSTEN FEATURE FILL WITH INHIBITION CONTROL

CLAIM OF PRIORITY

This application is a U.S. National Stage Filing under 35 U.S.C. 371 from International Application No. PCT/US2020/018103, filed on Feb. 13, 2020, and published as WO 2020/168071 A1 on Aug. 20, 2020, which claims the benefit of priority to U.S. Patent Application Ser. No. 62/805,197, filed on Feb. 13, 2019, each of which is incorporated by reference herein in its entirety.

FIELD

The present disclosure relates generally to tungsten feature fill with enhanced inhibition control, particularly for substrate processing in semiconductor manufacturing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Tungsten deposition is used to form conductive features like contacts, vias, and plugs on a chip. These features are small, often narrow, and use only a small amount of metal, so minimizing device resistance and achieving complete fill can be difficult. At nanoscale dimensions, even slight imperfections in features can impact device performance or cause a chip to fail.

As semiconductor manufacturers move to smaller technology nodes, tungsten contact metallization processes face significant scaling and integration challenges, such as minimizing contact resistance to meet the lower power consumption and high-speed requirements of advanced devices. For nanoscale structures, complete fill with tungsten (W) using conventional chemical vapor deposition (CVD) is limited by overhang from conventional barrier films and deposition techniques. This can result in closure of the feature opening before complete fill can take place, leading to voids, higher resistance, and contact failure. Even completely filled smaller features contain less tungsten, which results in higher contact resistance. Advanced memory and logic features require deposition techniques that enable complete, defect-free tungsten fill, while reducing resistivity of the bulk tungsten. Good barrier step coverage and lower resistivity at reduced thicknesses (relative to physical vapor deposition/CVD barrier films) is needed to improve contact fill and reduce contact resistance.

Deposition of conductive materials using CVD techniques is an integral part of many semiconductor fabrication processes. These materials may be used for horizontal interconnects, vias between adjacent metal layers, contacts between first metal layers and devices on the silicon substrate, and high aspect ratio features. In a conventional tungsten deposition process, a substrate is heated to a predetermined process temperature in a deposition chamber, and a thin layer of tungsten-containing material that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio features may cause formation of seams and voids inside the filled features. Large seams may lead to high resistance, contamination, and loss of filled materials and otherwise degrade performance of integrated circuits. For example, a seam may extend close to the field region after the filling process and then open during chemical-mechanical planarization (CMP).

SUMMARY

In some method examples, a method for selective inhibition control in substrate processing includes providing a substrate including a feature having one or more feature openings and a feature interior; forming a nucleation layer on a surface of the feature interior; based on a differential inhibition profile, selectively forming a nonconformal bulk layer on a surface of the nucleation layer to leave a region of the nucleation layer covered and a region of the nucleation layer uncovered by the nonconformal bulk layer; selectively forming an inhibition layer on the covered and uncovered regions of the nucleation layer, and selectively depositing tungsten in the feature in accordance with the differential inhibition profile.

In some examples, the nucleation layer formed on the surface of the feature interior is a conformal nucleation layer.

In some examples, the covered region of the nucleation layer includes an upper region of the feature interior.

In some examples, the upper region of the feature interior corresponds to a boundary of an outer surface of the nonconformal bulk layer formed between the conformal nucleation layer and the inhibition layer.

In some examples, the covered region of the nucleation layer is adjacent an open mouth of the feature.

In some examples, selectively forming the nonconformal bulk layer on the surface of the nucleation layer includes applying the bulk layer to the nucleation layer before an application of the inhibition layer to the covered region or the uncovered region of the nucleation layer.

In some examples, an example method further comprises forming the inhibition layer on the bulk layer in an upper region of the feature interior and forming the inhibition layer on the covered region of the nucleation layer in an intermediate region of the feature interior.

In some examples, an example method further comprises not forming an inhibition layer in an inhibition-free lower region of the feature interior.

In some examples, an example method further comprises not forming the nonconformal bulk layer in the intermediate region such that the inhibition layer lies directly on the nucleation layer in the intermediate region.

In some examples, a differential effect of the inhibition layer on the nonconformal bulk layer is relatively strong, and the differential effect of the inhibition layer on the nucleation layer is relatively weak.

In some system examples, a system includes a memory and at least one processor configured by instructions in the memory to perform or control operations in a method for selective inhibition control in substrate processing, the substrate including a feature having one or more feature openings and a feature interior, the operations including, at least: forming a nucleation layer on a surface of the feature interior; based on a differential inhibition profile, selectively forming a nonconformal bulk layer on a surface of the nucleation layer to leave a region of the nucleation layer covered and a region of the nucleation layer uncovered by the nonconformal layer; selectively forming an inhibition layer on the covered and uncovered regions of the nucleation layer; and selectively depositing tungsten in the feature in accordance with the differential inhibition profile. Further features of the system may include one or more of the operations of the example method summarized further above.

In further examples, a non-transitory machine-readable medium may include instructions which, when read by machine, because the machine to perform one or more of the operations of the example method summarized further above or elsewhere herein.

DESCRIPTION OF THE DRAWINGS

Some embodiments are illustrated by way of example and not limitation in the figures of the accompanying drawings:

FIG. 1H depicts a schematic example of a dynamic random access memory (DRAM) architecture including a bWL (bWL) in a silicon substrate.

FIG. 1I shows an unfilled and filled narrow asymmetric trench structure typical of DRAM bWL.

DESCRIPTION

Figures 1A, 1B:
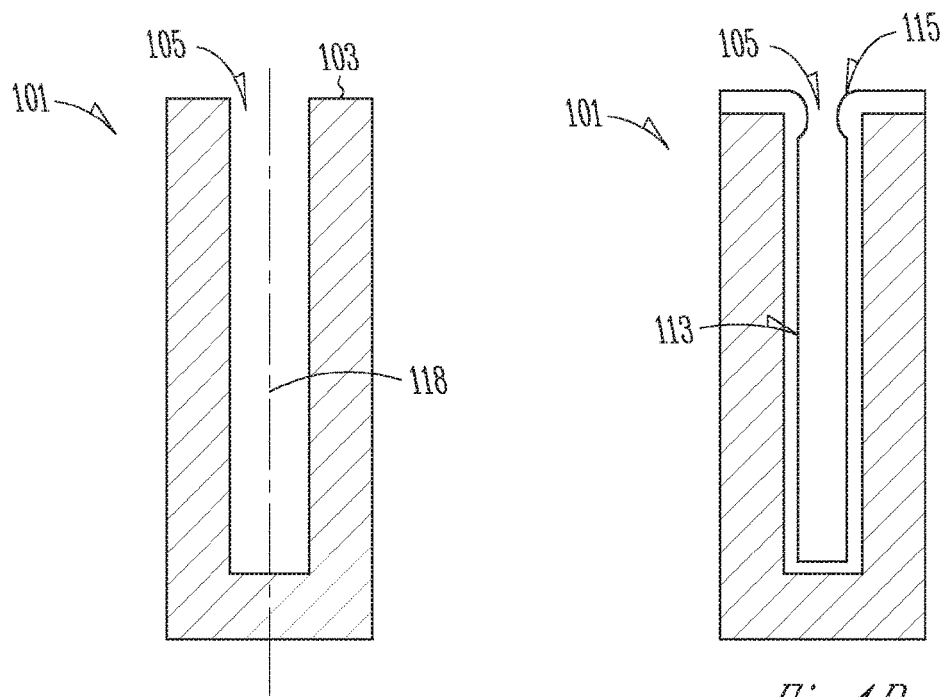
FIGS. 1A-1G show examples of various structures that can be filled according to the processes described herein.

The description that follows includes systems, methods, and techniques that embody illustrative embodiments of the present disclosure. In the following description, for purposes of explanation, numerous specific details are set forth in order to provide a thorough understanding of example embodiments. It will be evident, however, to one skilled in the art that the present inventive subject matter may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Lam Research Corporation 2019-2020, All Rights Reserved.

Described herein are methods of filling features with tungsten and related systems and apparatus. Examples of applications include logic and memory contact fill. DRAM bWL fill, vertically integrated memory gate/wordline fill, and three dimensional (3D) integration with through-silicon vias (TSVs). The methods described herein can be used to fill vertical features, such as in tungsten vias, and horizontal features, such as vertical NAND (VNAND) wordlines. The methods may be used for conformal and bottom-up or inside-out fill. In this specification, the terms layer and film are used interchangeably, unless the context indicates otherwise.

Figure 1C:
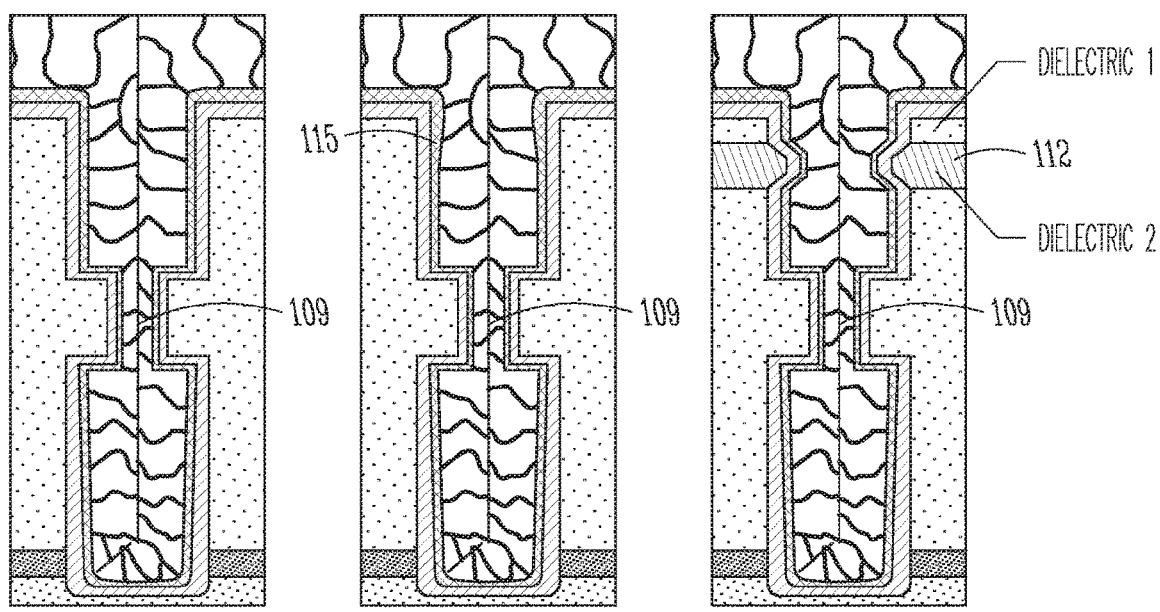

According to various embodiments, the features can be characterized by one or more of narrow and/or re-entrant openings, constrictions within the feature, and high aspect ratios. Examples of features that can be filled are depicted in FIGS. 1A-1C. FIG. 1A shows an example of a cross-sectional depiction of a vertical feature 101 to be filled with tungsten. The feature can include a feature hole 105 in a substrate 103. The substrate may be a silicon wafer, e.g., 200-mm wafer, 300-mm wafer, 450-mm wafer, including wafers having one or more layers of material such as dielectric, conducting, or semi-conducting material deposited thereon. In some embodiments, the feature hole 105 may have an aspect ratio of at least about 2:1, at least about 4:1, at least about 6:1, or higher. The feature hole 105 may also have a dimension near the opening, e.g., an opening diameter or line width, of between about 10 nm to 500 nm (for example, between about 25 nm to 300 nm). The feature hole 105 can be referred to as an unfilled feature or simply a feature. The feature, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a bottom, closed end, or interior of the feature to the feature opening. According to various embodiments, the profile may narrow gradually and/or include an overhang at the feature opening. FIG. 1B shows an example of the latter, with an underlayer 113 lining the sidewall or interior surfaces of the feature hole 105. The underlayer 113 can be, for example, a diffusion barrier layer, an adhesion layer, a nucleation layer, a combination of thereof, or any other applicable material. The underlayer 113 forms an overhang 115 such that the underlayer 113 is thicker near the opening of the feature 101 than inside the feature 101.

In some embodiments, features having one or more constrictions within the feature may be filled. FIG. 1C shows examples of views of various filled features having constrictions. Each of the examples (a), (b) and (c) in FIG. 1C includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b). As described further below, methods described herein allow void-free fill as depicted in FIG. 1C.

Figure 1D:
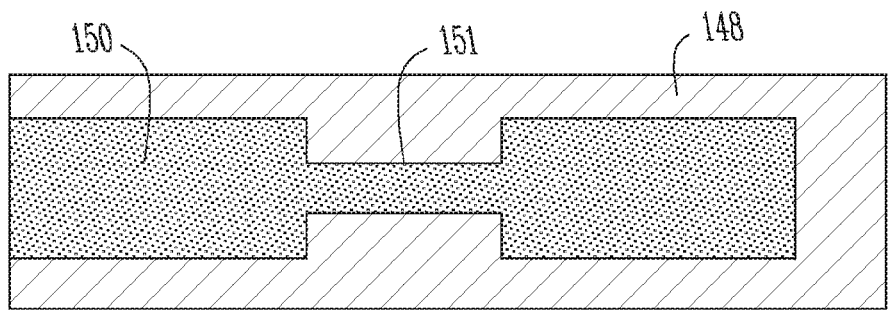
Figure 1E:
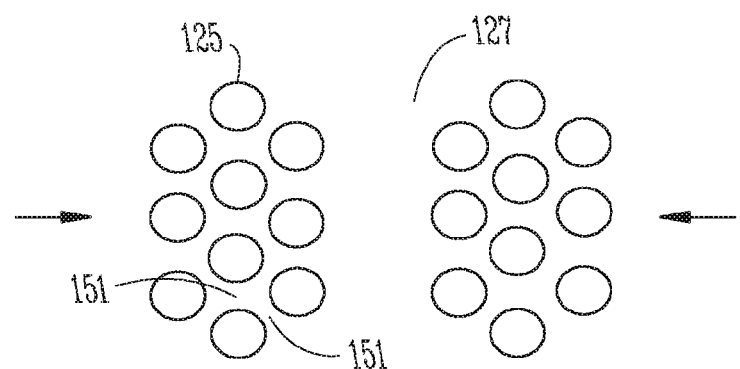
Figure 1F:
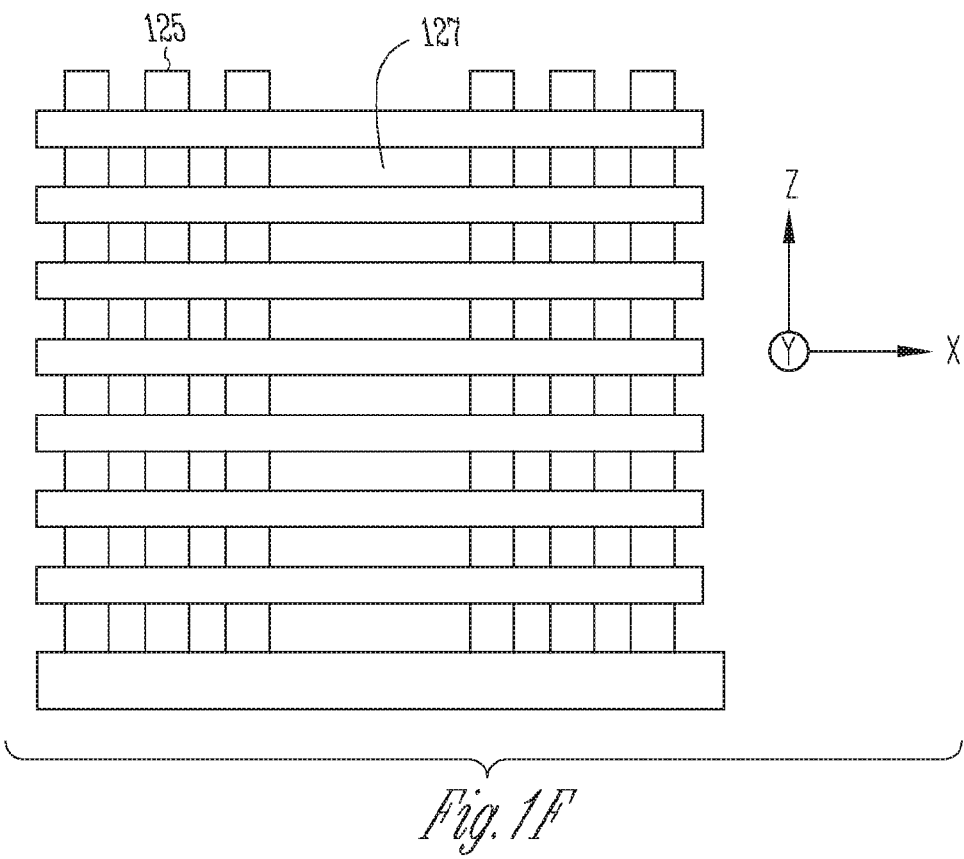

Horizontal features, such as in 3D memory structures, can also be filled. FIG. 1D shows an example of a word line 150 in a VNAND structure 148 that includes a constriction 151. In some embodiments, the constrictions can be due to the presence of pillars in a VNAND or other structure. FIG. 1E, for example, shows a plan view of pillars 125 in a VNAND structure, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions that present challenges in void free fill of an area 127.

Figure 1G:
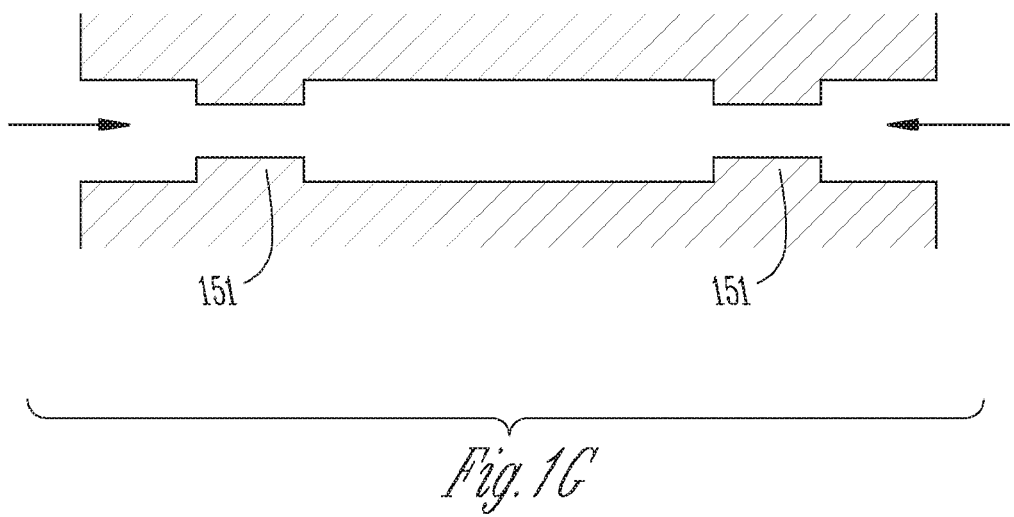
Figure 11:
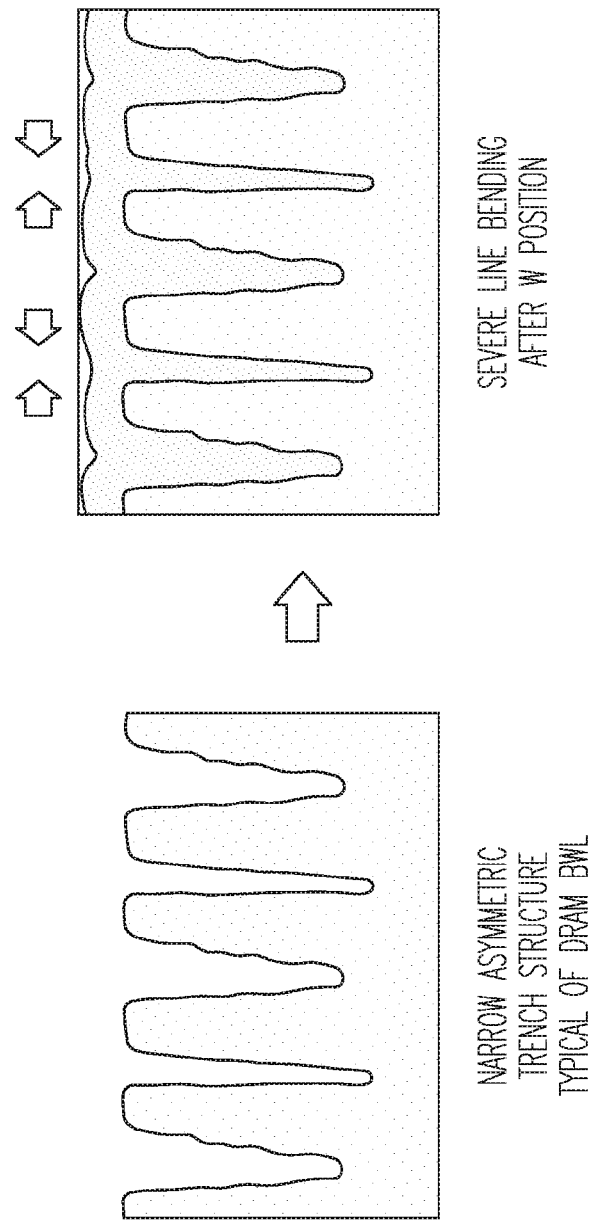

FIG. 1G provides another example of a view horizontal feature, for example, of a VNAND or other structure including pillar constrictions 151. The example in FIG. 1G is open-ended, with material to be deposited able to enter laterally from two sides as indicated by the arrows. (It should be noted that the example in FIG. 1G can be seen as a two-dimensional (2D) rendering of 3D features of the structure, with the FIG. 1G being a cross-sectional depiction of an area to be filled and pillar constrictions shown in the figure representing constrictions that would be seen in a plan rather than cross-sectional view.) In some embodiments, 3D structures can be characterized with the area to be filled extending along three dimensions (e.g., in the X, Y, and Z-directions in the example of FIG. 1F) and can present more challenges for fill than filling holes or trenches that extend along one or two dimensions. For example, controlling fill of a 3D structure can be challenging as deposition gasses may enter a feature from multiple dimensions.

Filling features with tungsten-containing materials may cause formation of voids and seams inside the filled features. A void is region in the feature that is left unfilled. A void can form, for example, when the deposited material forms a pinch point within the feature, sealing off an unfilled space within the feature and preventing reactant entry and deposition.

There are multiple potential causes for void and seam formation. One is an overhang formed near the feature opening during deposition of tungsten-containing materials or, more typically, other materials, such as a diffusion barrier layer or a nucleation layer. An example is shown in FIG. 1B.

Another cause of void or seam formation that is not illustrated in FIG. 1B but that nevertheless may lead to seam formation or enlarging seams is curved (or bowed) side walls of feature holes, which are also referred to as bowed features. In a bowed feature, the cross-sectional dimension of the cavity near the opening is smaller than that inside the feature. Effects of these narrower openings in the bowed features are somewhat similar to the overhang problem described above. Constrictions within a feature such as shown in FIGS. 1C, 1D, and 1G also present challenges for tungsten fill with few or no voids and seams.

Even if void free fill is achieved, tungsten in the feature may contain a seam running through the axis or middle of the via, trench, line, or another feature. This is because tungsten growth can begin at the sidewall and continue until the grains meet with tungsten growing from the opposite sidewall. This seam can allow for trapping of impurities including fluorine-containing compounds such as hydrofluoric acid (HF). During CMP, coring can also propagate from the seam. According to various embodiments, the methods described herein can reduce or eliminate void and seam formation. The methods described herein may also address one or more of the following:

1) Very challenging profiles: Void free fill can be achieved in most re-entrant features using dep-etch-dep cycles as described in U.S. patent application Ser. No. 13/351,970, incorporated by reference herein. However, depending on the dimensions and geometry, multiple dep-etch cycles may be needed to achieve void-free fill. This can affect process stability and throughput. Embodiments described herein can provide feature fill with fewer or no dep-etch-dep cycles.

2) Small features and liner/barrier impact: In cases where the feature sizes are extremely small, tuning the etch process without impacting the integrity of the underlayer liner/barrier can be very difficult. In some cases, intermittent Ti attack—possibly due to formation of a passivating TiFx layer during the etch—can occur during a W-selective etch.

3) Scattering at W grain boundaries: Presence of multiple W grains inside the feature can result in electron loss due to grain boundary scattering. As a result, actual device performance will be degraded compared to theoretical predictions and blanket wafer results.

4) Reduced via volume for W fill: Especially in smaller and newer features, a significant part of the metal contact is used up by the W barrier (TiN, WN etc.). These films are typically higher resistivity than W and negatively impact electrical characteristics like contact resistance and the like.

Particular embodiments relate to methods and related apparatus for formation of tungsten wordlines in memory devices. FIG. 1H depicts a schematic example of a DRAM architecture including a bWL 11 in a silicon substrate 9. The bWL is formed in a trench etched in the silicon substrate 9. Lining the trench is a conformal barrier layer 12 and an insulating layer 13 that is disposed between the conformal barrier layer 12 and the silicon substrate 9. In the example of FIG. 1H, the insulating layer 13 may be a gate oxide layer formed from a high-k dielectric material such as a silicon oxide or silicon nitride material. Examples of conformal barrier layers include tungsten-containing layers and titanium nitride (TiN). Tungsten-containing conformal barrier layers are described in U.S. patent application Ser. No. 15/051,561, which is incorporated by reference herein.

Figure 1J:
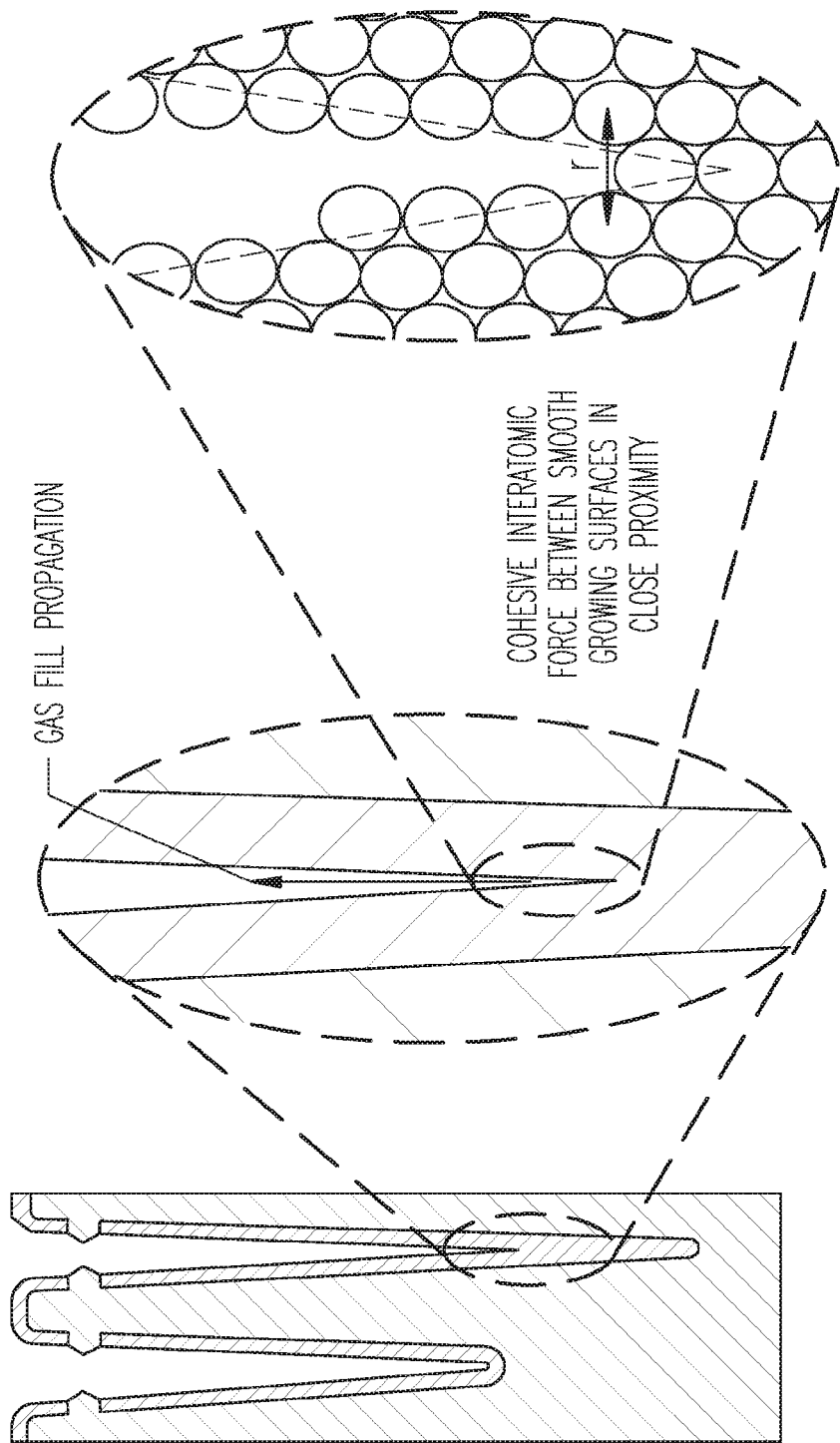
FIG. 1J illustrates the phenomena of line bending during gap fill.
Figure 1K:
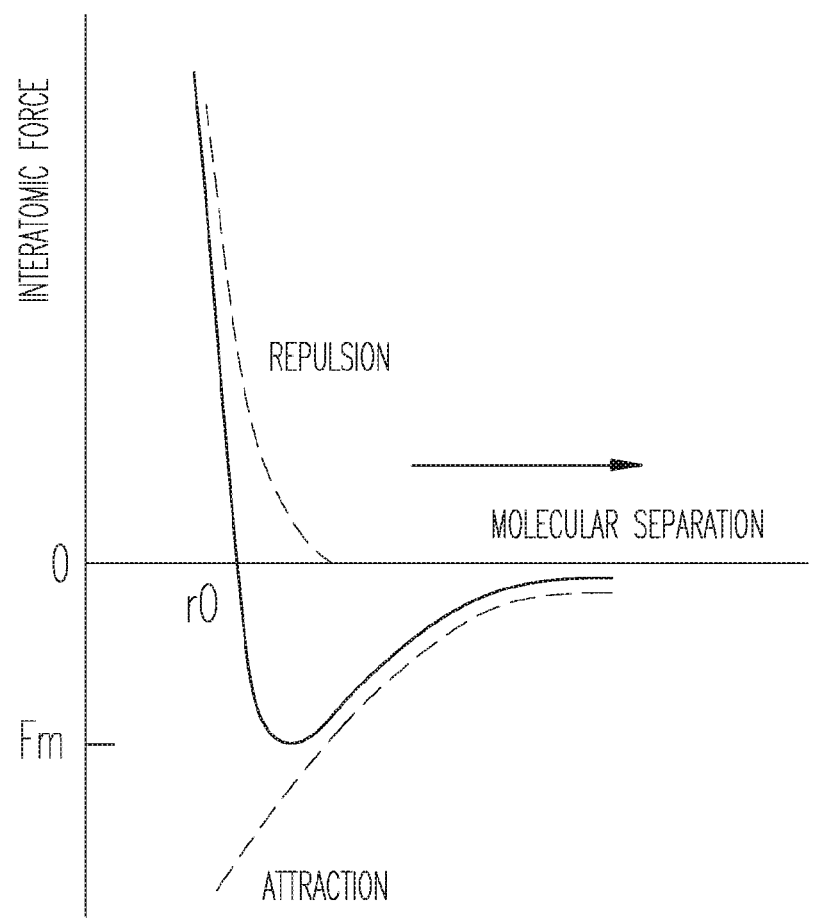
FIG. 1K is a graph illustrating interatomic force as a function of tungsten-tungsten bond radius, r.

Conventional deposition processes for DRAM bWL trenches tend to distort the trenches such that the final trench width and Rs is significantly non-uniform. FIG. 1I shows an unfilled and filled narrow asymmetric trench structure typical of DRAM bWL. The unfilled features are adjacent and generally V-shaped, having sloped sidewalls. The features widen from the feature bottom to the feature top. After tungsten fill, severe line bending is observed. Without being bound by a particular theory, it is believed that a cohesive force between opposing surfaces of a trench pulls the trench sides together. This phenomenon is illustrated in FIG. 1J and may be characterized as "zipping up" the feature. As the feature is filled, more force is exerted from a center axis of the feature, causing line bending. FIG. 1K illustrates the interatomic force as a function of tungsten-tungsten bond radius, r. As can be seen, a cohesive force exists at certain values of r. In some embodiments, the pitch (feature to feature distance from feature center axes) is below 50 nm, below 40 nm, or below 30 nm.

Figure 6:
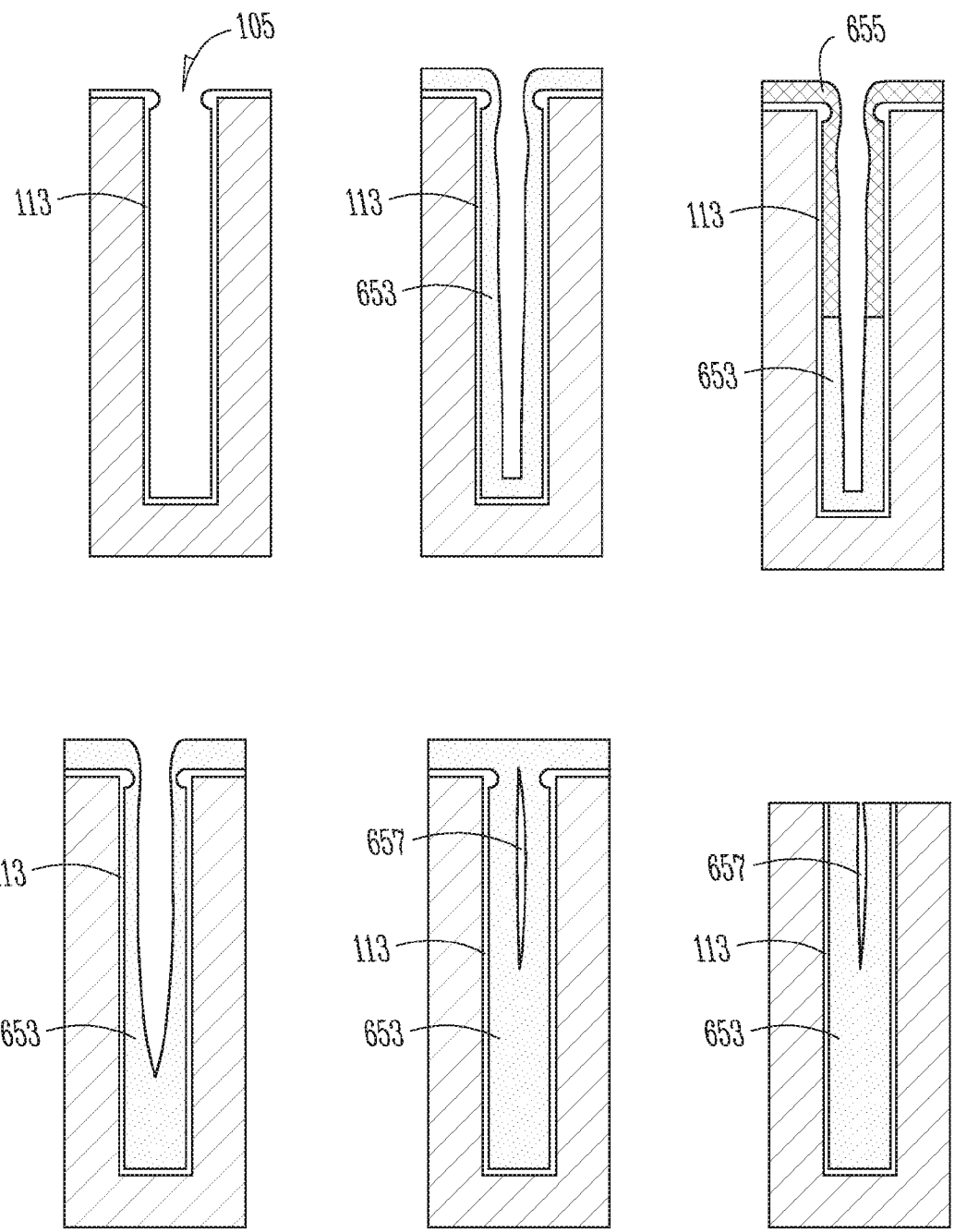
FIG. 6 is a schematic diagram showing a feature at various stages of feature fill.

Conventional inhibition techniques have not completely solved the problem of void formation. For example, FIG. 6 shows an example of a feature hole 105 including an underlayer 113, which can be, for example, a metal nitride or other barrier layer. A tungsten layer 653 is conformally deposited in the feature hole 10, for example, by a Pulsed Nucleation Layer (PNL) and/or CVD method. (Note that while the tungsten layer 653 is conformally deposited in the feature hole 105 in the example of FIG. 6, in some other embodiments, tungsten nucleation on the underlayer 113 can be selectively inhibited prior to selective deposition of the tungsten layer 653.) Further deposition on the tungsten layer 653 is then selectively inhibited, forming inhibited portion 655 of the tungsten layer 653 near the feature opening. Tungsten is then selectively deposited by a PNL and/or CVD method in accordance with the inhibition profile such that tungsten is preferentially deposited near the bottom and mid-section of the feature. Deposition continues, in some embodiments, with one or more selective inhibition cycles until the feature is filled. As described above, in some embodiments, the inhibition effect at the feature top can be overcome by a long enough deposition time, while in some embodiments, an additional nucleation layer deposition or other treatment may be performed to lessen or remove the passivation at the feature opening once deposition there is desired. Note that in some embodiments, feature fill may still include formation of a seam, such as seam 657 depicted in FIG. 6. The sequence depicted in the example of FIG. 6 may end post-CMP with a relatively small void still present.

Figure 2:
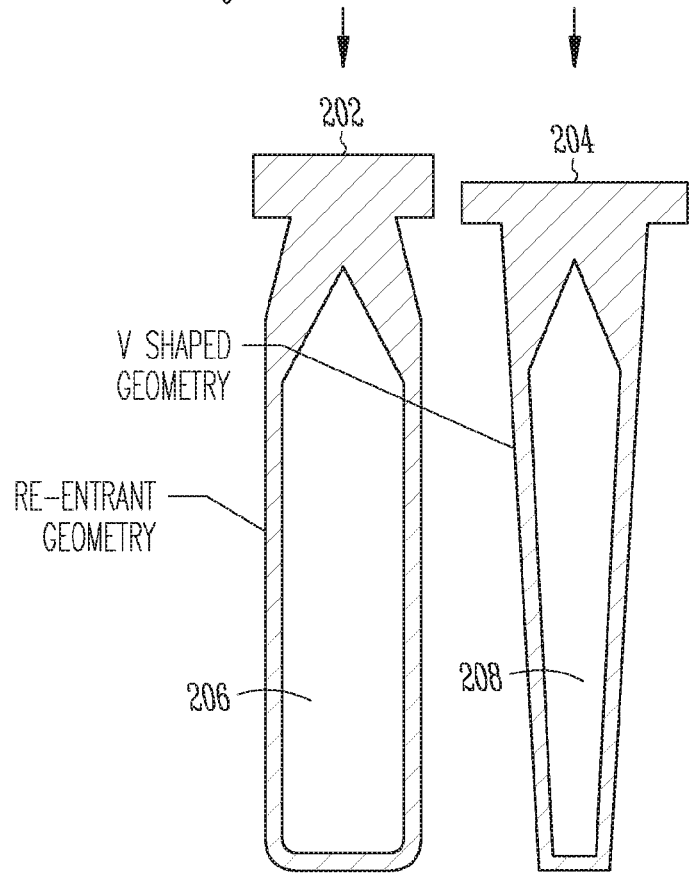
FIG. 2 shows schematic diagrams of two features, according to example embodiments.

FIG. 2 shows schematic diagrams of two features 202 and 204. Feature 202 has a re-entrant geometry and feature 204 has a V-shaped geometry. The features 202 and 204 have been formed using deposition only at ultra-low stress deposition conditions. At low flow levels of tungsten hexafluoride (WF6) and higher temperatures, WF6 depletion near the field results in voids 206 and 208, as shown. Attempts to cure such voids 206 and 208 have included inhibition, and the use of inhibiting precursor gases. One such technique is known as inhibition chemistry enhancement, or ICE.

Figure 3:
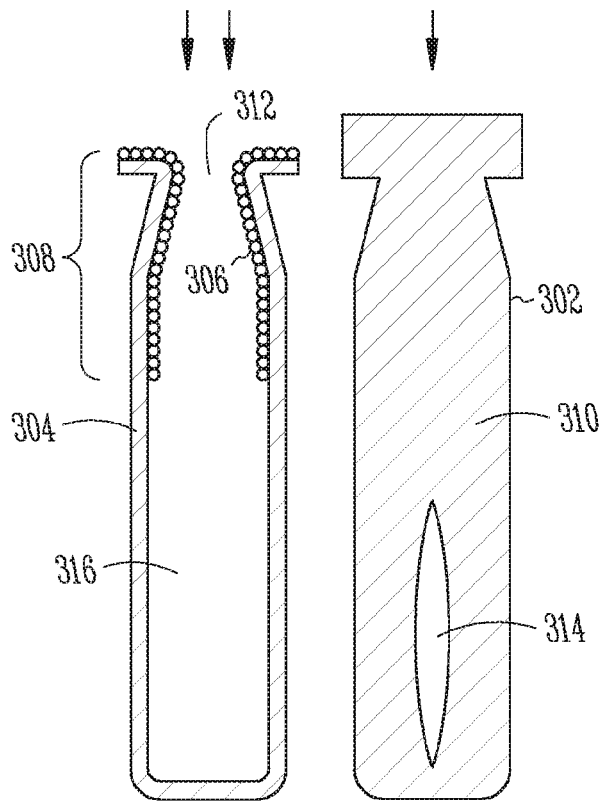
FIG. 3 shows schematic views of a feature during feature development, according to example embodiments.

With reference to FIG. 3, schematic views of a feature 302 are shown during feature development. Initially, a conformal nucleation (nuc) layer 304 is formed by a first deposition (dep1). A conformal inhibition (or ICE) layer 306 is formed over an upper region 308 of the nucleation layer 304, as shown. A second deposition (or dep2) forms a nonconformal bulk layer 310 for the completed feature 302 shown on the right. The inhibition ICE layer 306 is intended to inhibit growth of the bulk later 310 to keep the mouth (or restriction) 312 of the trench 316 open during fill (e.g., W-fill). This effect may also be expressed as a differentiation ICE effect. Notwithstanding the differentiation effect of the inhibition layer 306, a void 314 has nevertheless been formed.

Selective inhibition, which may also be referred to as selective passivation, differential inhibition, or differential passivation, involves inhibiting subsequent tungsten nucleation on a portion of the feature, while not inhibiting nucleation (or inhibiting nucleation to a lesser extent) on the remainder of the feature. For example, in some embodiments, a feature is selectively inhibited at a feature opening, while nucleation inside the feature is not inhibited. Selective inhibition can involve, for example, selectively exposing a portion of the feature to activated species of a plasma. In certain embodiments, for example, a feature opening is selectively exposed to a plasma generated from molecular nitrogen gas. A desired inhibition profile in a feature can be formed by appropriately selecting one or more of inhibition chemistry, substrate bias power, plasma power, process pressure, exposure time, and other process parameters. Further aspects relating to the formation of inhibition profiles and differential inhibition are described in U.S. patent application Ser. No. 15/640,940, incorporated by reference herein.

As noted above, low flow levels of tungsten hexafluoride (WF6) and higher temperatures lead to WF6 depletion. A WF6 depleted environment typically calls for a strong, conformal ICE layer 306 to withstand, or inhibit, rapid creation of the bulk layer 310 at the mouth 312 thereof so that the mouth 312 remains clear to admit fill allowing the trench 316 to be filled completely. But in the example of FIG. 3, sufficient inhibition (or a desired inhibition profile) has not occurred. The illustrated mouth 312 has closed off prematurely and the void 314 has been formed due to a lack of fill reaching it. It will be appreciated that such voids can significantly negatively affect device performance. The avoidance of voids 314 can be particularly problematic in the formation of very high aspect features and in filling deep trenches, vias, and the like.

A desired inhibition profile may be created based on several factors. Factors may include the growth retarding effect of a given inhibition layer, a nature (e.g., conformality) or condition (e.g., stress) of an underlying nucleation or deposition layer to which the inhibition layer is applied, and chamber processing conditions, among others.

Figure 4:
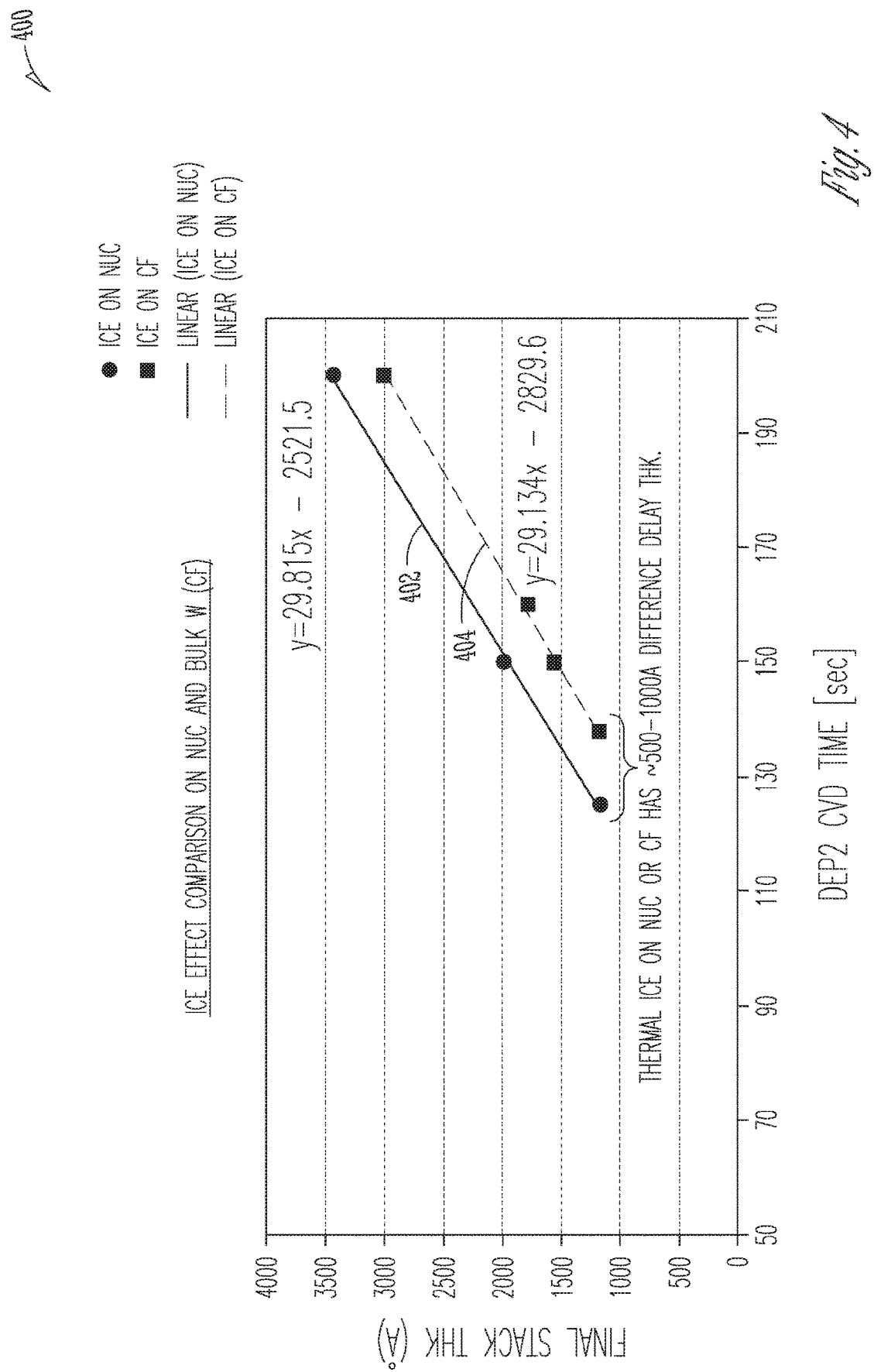
FIG. 4 shows a growth profile graph, according to an example embodiment.

For example, with reference to the graph 400 in FIG. 4, two linear graphs lines 402 and 404 representing growth profiles of two films may be observed. The y axis of graph 400 depicts a final stack height or thickness (THK) of the films in Angstrom (A) during a deposition operation (for example, during (dep2)). The x axis depicts corresponding CVD times in seconds during the deposition. The slope ($\Delta y/\Delta x$) of a linear line 402 or 404 may be considered to represent a speed of growth of the films (i.e., rate of thickness growth over time).

The linear line 402 represents a growth profile for an example film formed by applying a thermal inhibition layer (ICE) to a nucleation layer (nuc) alone. The example linear line 402 may be expressed mathematically in the graph 400 as $y=29.815x-2521.5$. In contrast, the linear line 404 represents a growth profile for an example film formed by applying a thermal inhibition layer (ICE) to a bulk layer (or cool film (CF)). The example linear line 404 may be expressed mathematically in the graph 400 as $y=29.134x-2829.6$.

It will be seen that the linear line 404 (i.e., representing a film growth profile) has "shifted" (or at least appears) to the right in the graph 400 as compared to linear line 402. In effect, the film formed in the circumstances of linear line 404 has taken longer (there has been a "delay") to reach the same height as the film of linear line 402, even though the rate of growth (slope) of the respective films has been substantially the same. Expressed another way, for the same elapsed time on the x axis, the thickness of the film of line 404 has lagged that of the film of line 402. There has been a lag or "difference" in thickness. In the illustrated example, the "difference" may be expressed as approximately 500-1000 A. If multiple inhibited layers within an interior of a feature face each other, for example, the differential effect (or inhibition profile) may be multiplied or enhanced accordingly. For example, a "difference" (or inhibition profile) between two layers facing each other on either side of a trench, with each layer having undergone the same inhibition, may be considered to have doubled (i.e., 1000-2000 A, or more in some examples).

The inhibition or "differential effect" of the inhibition layer used in the examples of lines 402 and 404 has thus been different based primarily, in this example, on the nature and type of film to which the inhibition layer has been applied (i.e., nucleation versus bulk). High aspect features and growth profiles may be formed using improved selective inhibition accordingly, in conformance with examples of the present disclosure. Some examples include the maintenance of free passage for fill material within features during fill operations and, in some examples, the complete removal of voids. In this regard, reference is now made to FIG. 5.

Figure 5:
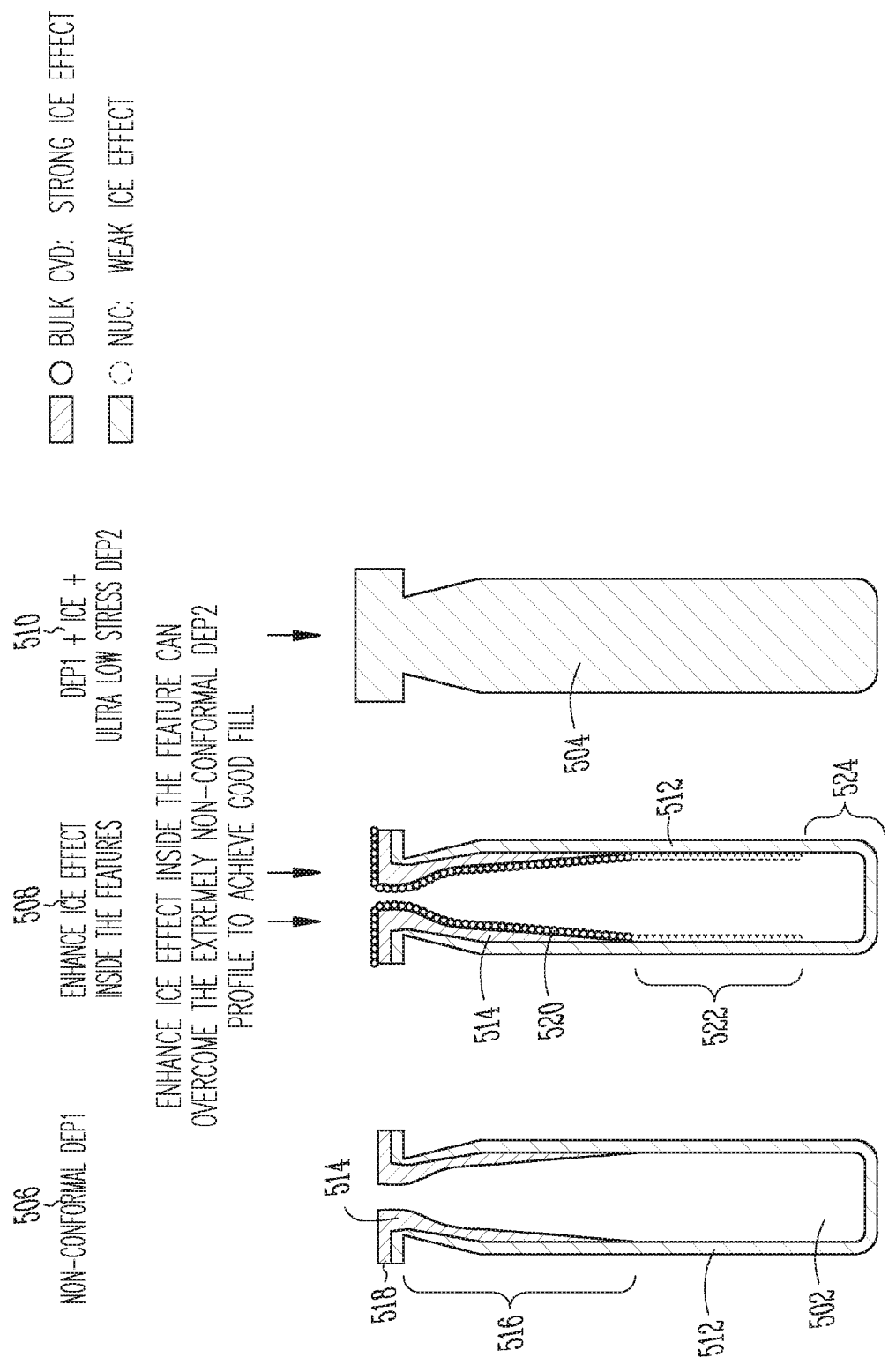
FIG. 5 illustrates example operations in an example method, according to example embodiments.

FIG. 5 illustrates example operations in an example method of the present disclosure. Here, a trench 502 is to be filled to form a feature 504 in the various phases shown in the views of operations 506 through 510. Initially, a conformal nucleation layer 512 is formed on an interior surface of the trench 502. In operation 506, a nonconformal bulk layer 514 is then formed over the nucleation layer 512 in an upper region 516 of the trench 502, as shown. The upper region 516 is adjacent the open mouth of the trench 502 which, as discussed above, may conventionally be prone to closure, thereby disallowing a complete fill and the formation of voids in the feature 504. The formation of the nonconformal bulk layer 514 may occur in an initial nonconformal deposition phase (dep1, operation 506). A small degree of overburden 518 may appear on the substrate field adjacent the open mouth of the trench 502. The nonconformal bulk layer 514 is applied over the nucleation layer 512 before the application of an inhibition layer.

In operation 508, an inhibition layer 520 is applied over the nonconformal bulk layer 514 and to interior surfaces of the trench 502 as shown. In the illustrated example, the inhibition layer 520 is applied to the nonconformal bulk layer 514 in an upper region 516 of the trench and the nucleation layer 512 in an intermediate region 522 of the trench, but is not applied to the nucleation layer 512 in a inhibition-free lower region 524 of the trench 502.

As shown, the upper region 516 of the trench 502 corresponds to a boundary of an outer surface of the nonconformal bulk layer 514 interposed between the conformal nucleation layer 512 and the inhibition layer 520. In the intermediate region 522, the nonconformal bulk layer 514 (or any layer) has not been formed and the inhibition layer 520 lies directly on the nucleation layer 512. As noted from FIG. 4 above, the differential effect of an inhibition layer on a bulk layer is strong, whereas its inhibition effect on a nucleation layer is relatively weak.

In operation 510, the trench is filled in a subsequent deposition operation (e.g., nonconformal dep2). In the illustrated example, the strong inhibition effect of the inhibition layer 520 in upper region 516, adjacent the mouth of the trench, keeps the mouth free. During dep2 (for example), the nonconformal bulk film in that region grows slowly, whereas film in the weaker inhibition zone lower down in intermediate region 522 grows relatively faster. The growth of film adjacent the mouth is "delayed" in the manner discussed further above. The differential inhibition (or growth profile) allows fill to reach the bottom of the trench 502 to form an integral feature 504 substantially free of voids. Thus, the selective formation of an initial nonconformal bulk layer inside a feature, before an inhibition layer is applied, can enhance inhibition or differentiation effects therein to provide a void-free fill, at least in some examples.

Thus, in some embodiments, a method may comprise providing a substrate including a feature having one or more feature openings and a feature interior; forming a nucleation layer on a surface of the feature interior; based on a differential inhibition profile, selectively forming a nonconformal bulk layer on the surface of the nucleation layer to leave regions of the nucleation layer covered and uncovered by the nonconformal bulk layer; selectively forming an inhibition layer on the covered and uncovered regions of the nucleation layer; and selectively depositing tungsten in the feature in accordance with the differential inhibition profile.

Although an embodiment has been described with reference to specific example embodiments, it will be evident that various modifications and changes may be made to these embodiments without departing from the broader scope of the disclosure and claims invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A method for selective inhibition control in substrate processing, the method including:
    providing a substrate including a feature having one or more feature openings and a feature interior;
    forming a nucleation layer on a surface of the feature interior;
    depositing a nonconformal bulk layer on a surface of the nucleation layer to leave a region of the nucleation layer covered, and a region of the nucleation layer uncovered by the nonconformal bulk layer;
    forming an inhibition layer on the covered and uncovered regions of the nucleation layer; and
    depositing tungsten in the feature.

2. The method of claim 1, wherein the nucleation layer formed on the surface of the feature interior is a conformal nucleation layer.

3. The method of claim 2, wherein the covered region of the nucleation layer includes an upper region of the feature interior.

4. The method of claim 3, wherein the upper region of the feature interior corresponds to a boundary of an outer surface of the nonconformal bulk layer formed between the conformal nucleation layer and the inhibition layer.

5. The method of claim 1, wherein the covered region of the nucleation layer is adjacent an open mouth of the feature.

6. The method of claim 1, further comprising forming the inhibition layer on the bulk layer in an upper region of the feature interior, and forming the inhibition layer on the covered region of the nucleation layer in an intermediate region of the feature interior.

7. The method of claim 6, further comprising not forming an inhibition layer in an inhibition-free lower region of the feature interior.

8. The method of claim 6, further comprising not forming the nonconformal bulk layer in the intermediate region such that the inhibition layer lies directly on the nucleation layer in the intermediate region.

9. The method of claim 1, wherein an inhibition effect of the inhibition layer on the nonconformal bulk layer is stronger than an inhibition effect of the inhibition layer on the nucleation layer.

10. The method of claim 1, wherein the tungsten deposition is thicker on the inhibition layer formed on the uncovered regions of the nucleation layer than on the inhibition layer formed on the covered regions.

* * * * *